US010181490B2

(12) United States Patent
Watanabe et al.

(10) Patent No.: US 10,181,490 B2
(45) Date of Patent: Jan. 15, 2019

(54) CROSS TALK REDUCTION FOR HIGH DYNAMIC RANGE IMAGE SENSORS

(71) Applicant: OmniVision Technologies, Inc., Santa Clara, CA (US)

(72) Inventors: Kazufumi Watanabe, Mountain View, CA (US); Chih-Wei Hsiung, San Jose, CA (US); Dyson Tai, San Jose, CA (US); Lindsay Grant, Los Gatos, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/478,085

(22) Filed: Apr. 3, 2017

(65) Prior Publication Data
US 2018/0286895 A1 Oct. 4, 2018

(51) Int. Cl.
*H01L 27/146* (2006.01)
*H04N 9/04* (2006.01)
*H04N 5/378* (2011.01)

(52) U.S. Cl.
CPC .... *H01L 27/1463* (2013.01); *H01L 27/14612* (2013.01); *H01L 27/14621* (2013.01); *H01L 27/14627* (2013.01); *H01L 27/14645* (2013.01); *H01L 27/14683* (2013.01); *H04N 5/378* (2013.01); *H04N 9/045* (2013.01)

(58) Field of Classification Search
CPC ... H01L 27/14; H01L 27/146; H01L 27/1463; H01L 27/14612; H01L 27/14621; H01L 27/14627; H01L 27/14645; H01L 27/14683

See application file for complete search history.

(56) References Cited

U.S. PATENT DOCUMENTS

| 9,431,452 | B1* | 8/2016 | Liu | H01L 27/14645 |
| 9,437,645 | B1* | 9/2016 | Chou | H01L 27/14645 |
| 9,443,899 | B1* | 9/2016 | Liu | H01L 27/14643 |
| 9,923,009 | B1* | 3/2018 | Hsiung | H05K 999/99 |
| 2005/0285215 | A1* | 12/2005 | Lee | H01L 27/14603 257/432 |
| 2015/0236058 | A1* | 8/2015 | Hu | H01L 27/1463 250/208.1 |
| 2015/0243805 | A1* | 8/2015 | Chien | H01L 27/1464 257/432 |
| 2015/0340391 | A1* | 11/2015 | Webster | H01L 27/14605 348/322 |

(Continued)

*Primary Examiner* — Fazli Erdem

(57) ABSTRACT

A multi-color HDR image sensor includes at least a first combination color pixel with a first color filter and an adjacent second combination color pixel with a second color filter which is different from the first color filter, wherein each combination color pixel includes at least two sub-pixels having at least two adjacent photodiodes. Within each combination color pixel, there is a dielectric deep trench isolation (d-DTI) structure to isolate the two adjacent photodiodes of the two adjacent sub-pixels with same color filters in order to prevent the electrical cross talk. Between two adjacent combination color pixels with different color filters, there is a hybrid deep trench isolation (h-DTI) structure to isolate two adjacent photodiodes of two adjacent sub-pixels with different color filters in order to prevent both optical and electrical cross talk. Each combination color pixel is enclosed on all sides by the hybrid deep trench isolation (h-DTI) structure.

16 Claims, 6 Drawing Sheets

(56) References Cited

U.S. PATENT DOCUMENTS

2016/0276394 A1* 9/2016 Chou ................ H01L 27/14645
2017/0062496 A1* 3/2017 Lai ..................... H01L 27/1463
2017/0077157 A1* 3/2017 Cheng ............... H01L 27/14621
2017/0301718 A1* 10/2017 Chou ................ H01L 27/14645

* cited by examiner

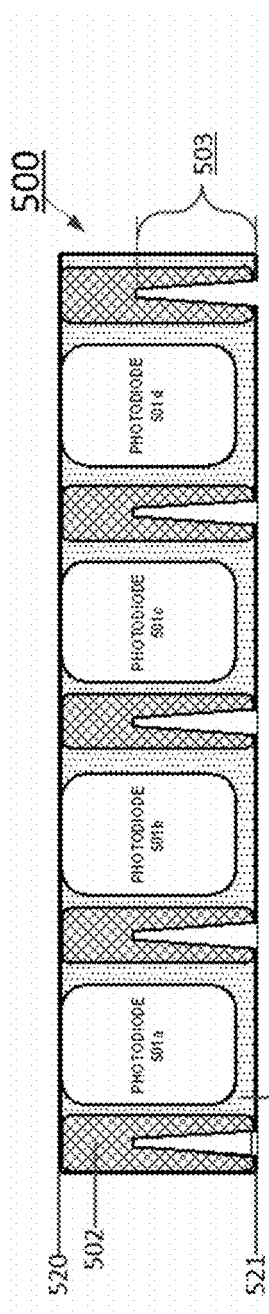
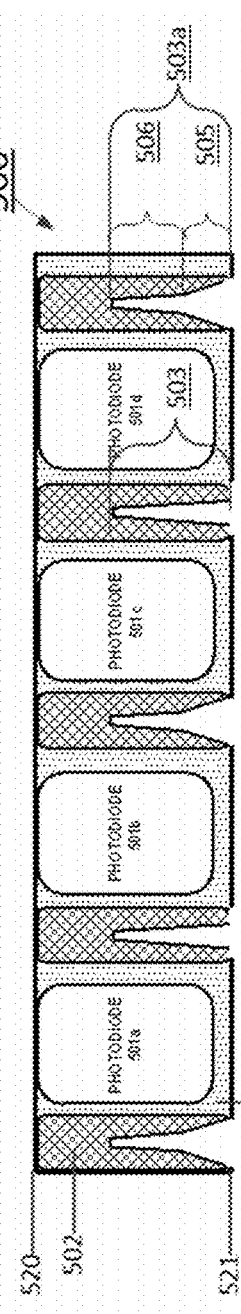
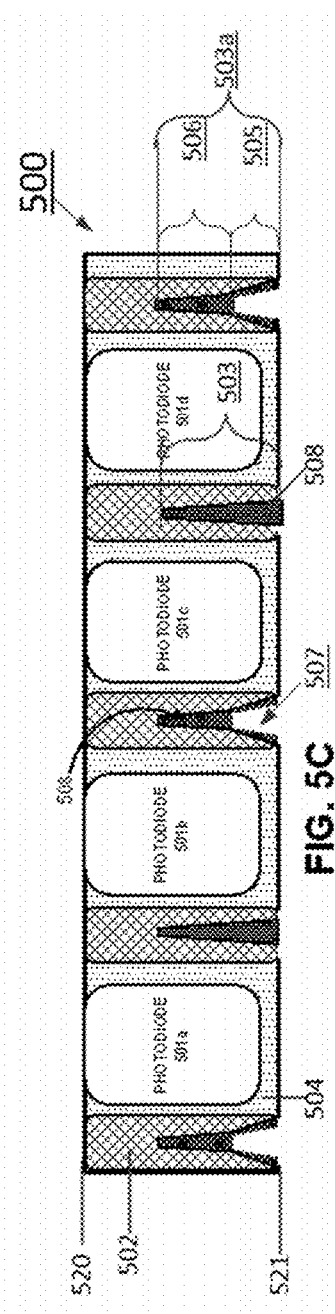
FIG. 5A
FIG. 5B
FIG. 5C

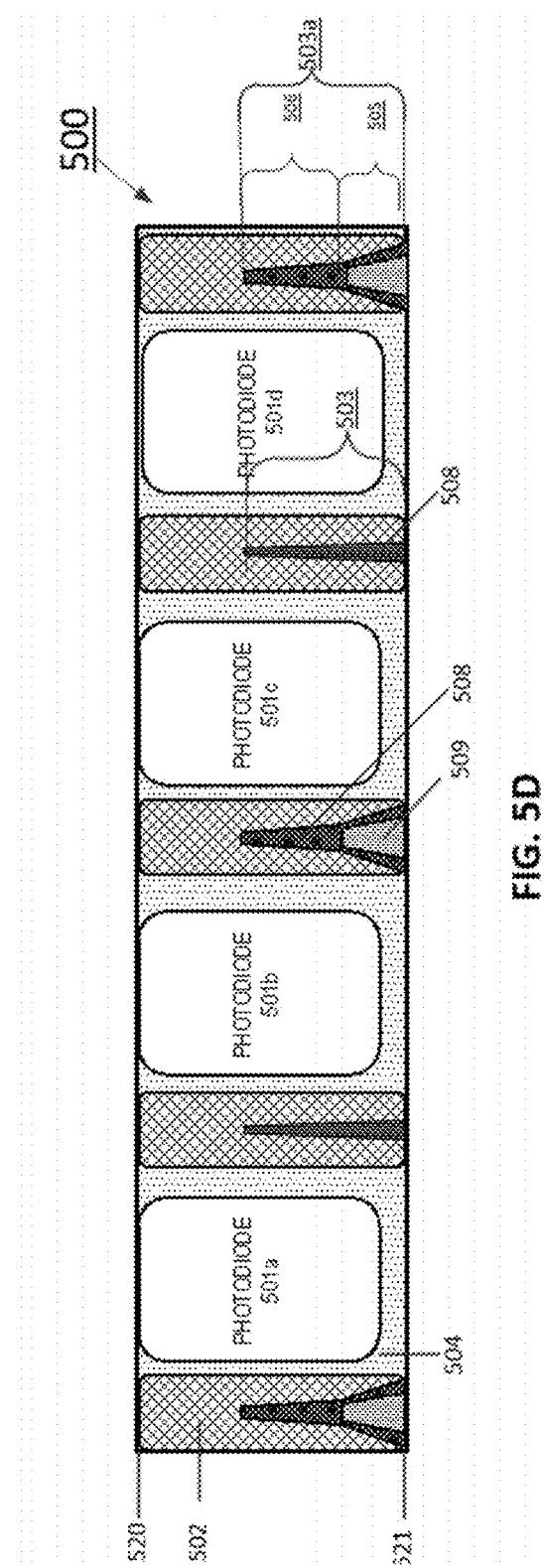

US 10,181,490 B2

CROSS TALK REDUCTION FOR HIGH DYNAMIC RANGE IMAGE SENSORS

TECHNICAL FIELD

This disclosure relates generally to semiconductor image sensors, and in particular but not exclusively, relates to the pixel isolation structures in high dynamic range image sensors.

BACKGROUND INFORMATION

Image sensors have become ubiquitous. They are widely used in digital still cameras, cellular phones, security cameras, as well as medical, automobile and other applications. The typical image sensor operates as follows. Image light from an external scene is incident on the image sensor. The image sensor includes a plurality of photosensitive elements such that each photosensitive element absorbs a portion of the incident image light. Each photosensitive element included in the image sensor, such as photodiodes, generates image charges upon absorption of the image light. The amount of generated image charges is proportional to the intensity of the image light. The generated image charges may be used to produce an image representing the external scene.

The device architecture of image sensors has continued to advance at a great pace due to increasing demands for higher resolution, lower power consumption, increased dynamic range, etc. These demands have also encouraged the further miniaturization and integration of image sensors into these devices. For high dynamic range image sensors, combination pixels are usually used to sense individual electromagnetic radiation wavelength in order to accommodate a wide range of lighting situations. For example, in a combination red pixel, one sub-pixel can be used to sense bright red light conditions while another sub-pixel can be used to sense low red light conditions. The miniaturization of image sensors may result in a decreased distance between neighboring photosensitive elements. As the distance between photosensitive elements decreases, the likelihood and magnitude of optical and electrical crosstalk between photosensitive elements may increase.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 5A-5D illustrate an example fabrication method of the image sensor in FIG. 4, in accordance with an embodiment of the disclosure.

Figure 1:
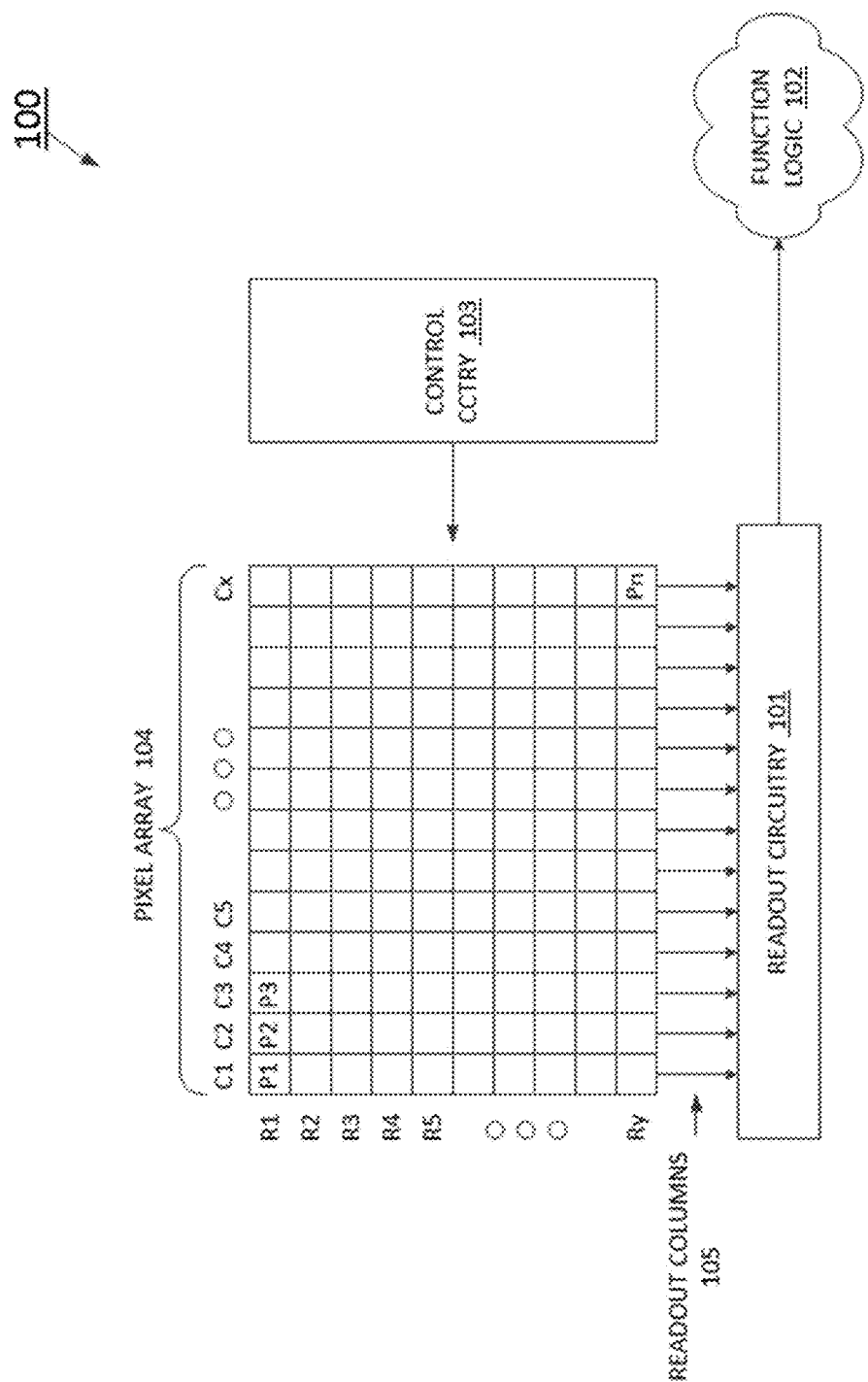
FIG. 1 is a block diagram schematically illustrating one example of a high dynamic range ("HDR") imaging system, in accordance with an embodiment of the disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with both hybrid deep trench isolation structures and dielectric deep trench isolation structures are described herein. In the following description, numerous specific details are set forth to provide a thorough understanding of the examples. However, one skilled in the relevant art will recognize that the techniques described herein can be practiced without one or more of the specific details, or with other methods, components, materials, etc. In other instances, well-known structures, materials, or operations are not shown or described in details in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is a block diagram illustrating one example of imaging system 100. Imaging system 100 includes pixel array 104, control circuitry 103, readout circuitry 101, and function logic 102. In one example, pixel array 104 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel in pixel array 104 has acquired its image data or image charge, the image data is readout by readout circuitry 101 and then transferred to functional logic 102. In various examples, readout circuitry 101 may include amplification circuitry, analog-to-digital (ADC) conversion circuitry, or otherwise. Function logic 102 may simply store the image data or even manipulate the image data by applying post image effects (e.g., crop, rotate, remove red eye, adjust brightness, adjust contrast, or otherwise). In one example, readout circuitry 101 may read out a row of image data at a time along readout column lines (illustrated) or may readout the image data using a variety of other techniques (not illustrated), such as a serial readout or a full parallel readout of all pixels simultaneously.

In one example, control circuitry 103 is coupled to pixel array 104 to control operation of the plurality of photodiodes in pixel array 104. For example, control circuitry 103 may generate a shutter signal for controlling image acquisition. In one example, the shutter signal is a global shutter signal for simultaneously enabling all pixels within pixel array 104 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, automobile or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
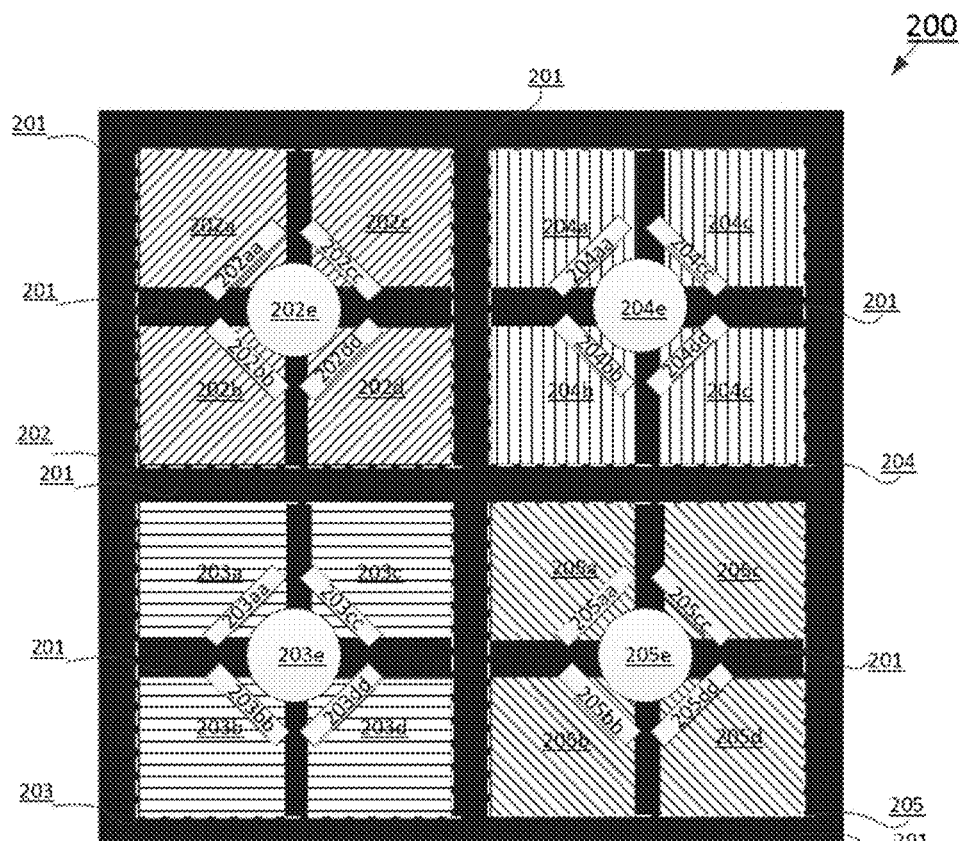
FIG. 2 is a plan view illustration of a multi-color HDR image sensor that includes four combination color pixels that each pixel includes four HDR sub-pixels having four photodiodes isolated by dielectric deep trench isolation (d-DTI) structures.

FIG. 2 is a plan view illustration of a multi-color HDR image sensor 200 that includes four combination color pixels that each pixel includes four HDR sub-pixels having four photodiodes. The four combination color pixels include a combination red pixel 202, a first combination green pixel 203, a second combination green pixel 204, and a combination blue pixel 205. Each combination color pixel includes four HDR sub-pixels that include 4 photodiodes sharing a common floating diffusion at the center of the color pixel, wherein each photodiode has an individual transfer gate. As one example, the combination red pixel 202 has four photodiode 202a, 202b, 202c and 202d. The photodiode 202a has a transfer gate 202aa, the photodiode 202b has a transfer gate 202bb, the photodiode 202c has a transfer gate 202cc, and the photodiode 202d has a transfer gate 202dd. The photodiode 202a, 202b, 202c and 202d share a common floating diffusion 202e at the center of the combination red pixel 202. There is a standard d-DTI structure 201 to isolate the adjacent photodiodes in order to prevent the electrical cross talk. However, such d-DTI structure 201 may not fully block the optical cross talk between the adjacent sub-pixel photosensitive elements with different color filters, such as the optical cross talk between 202b and 203a, 202d and 203c, 204b and 205a, or 204d and 205c. It is desirable to improve the isolation structures between adjacent sub-pixels with different color filters in order to reduce not only electrical cross talk but also optical cross talk for better imaging resolution.

Figure 3:
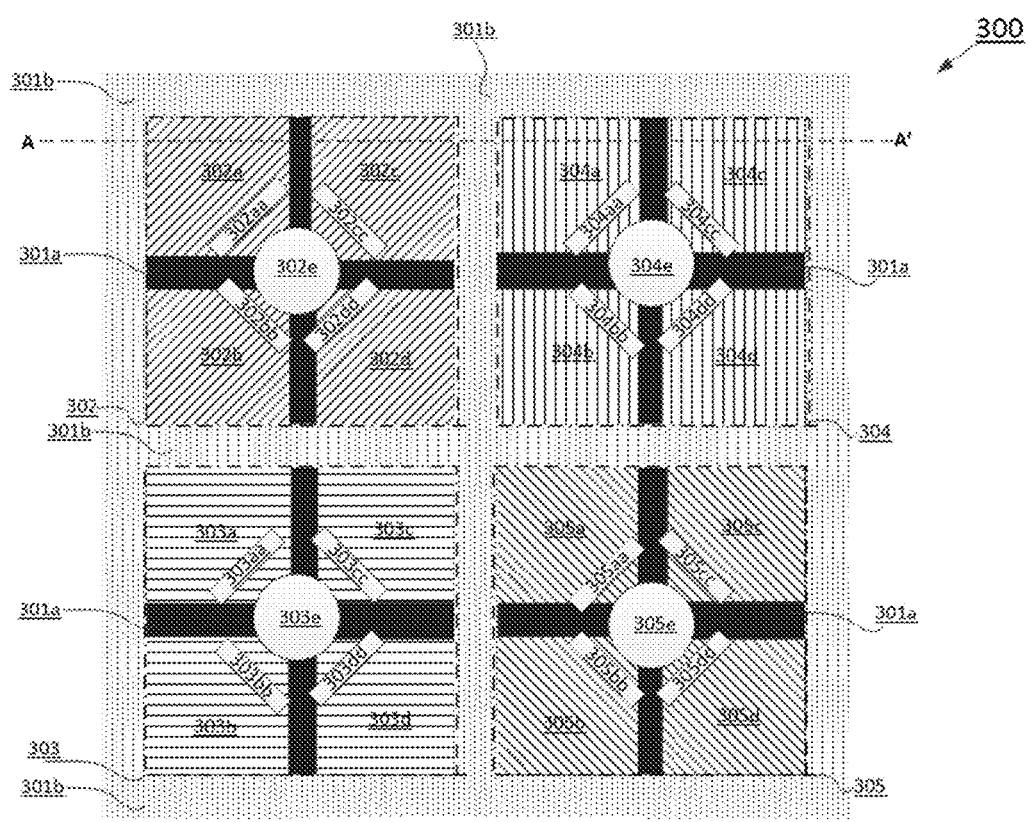
FIG. 3 is a plan view illustration of a multi-color HDR image sensor that includes four combination color pixels that each pixel includes four HDR sub-pixel having four photodiodes isolated by both hybrid deep trench isolation (h-DTI) structures and d-DTI structures, in accordance with an embodiment of the disclosure.

FIG. 3 is a plan view illustration of a multi-color HDR image sensor 300 that includes four combination color pixels that each pixel includes four HDR sub-pixels having four photodiodes isolated by both h-DTI structures and d-DTI structures, in accordance with an embodiment of the disclosure. In one example, the four combination color pixels include a combination red pixel 302, a combination blue pixel 303, a combination green pixel 304, and a combination IR pixel 305. The four combination color pixels may also include combination secondary primary color (magenta, yellow and cyan) pixels, combination black pixels and combination white (or clear) pixels. The adjacent combination color pixels could be the same combination color pixels or different combination color pixels. Each combination color pixel includes four HDR sub-pixels that include 4 photodiodes sharing a common floating diffusion at the center of the combination color pixel, and each photodiode has its own transfer gate. Each of the HDR sub-pixels may have the same physical configurations and electrical circuit configurations. The HDR sub-pixels may also have the different physical configurations and electrical circuit configurations. Within each combination color pixel, there is a d-DTI structure 301a to isolate two adjacent photodiodes of two adjacent sub-pixels with same color filters in order to prevent the electrical cross talk. Between two adjacent combination color pixels with different color filters, there is a h-DTI structure 301b to isolate two adjacent photodiodes of two adjacent sub-pixels with different color filters in order to prevent both optical and electrical cross talk. In one example, each combination color pixel is enclosed on all sides by the h-DTI structure 301b.

In one example demonstrated in FIG. 3, the combination red pixel 302 has four photodiode 302a, 302b, 302c and 302d. The photodiode 302a has a transfer gate 302aa, the photodiode 302b has a transfer gate 302bb, the photodiode 302c has a transfer gate 302cc, and the photodiode 302d has a transfer gate 302dd. The photodiode 302a, 302b, 302c and 302d share a common floating diffusion 302e at the center of the combination red pixel 302. The combination green pixel 304 has four photodiode 304a, 304b, 304c and 304d. The photodiode 304a has a transfer gate 304aa, the photodiode 304b has a transfer gate 304bb, the photodiode 304c has a transfer gate 304cc, and the photodiode 304d has a transfer gate 304dd. The photodiode 304a, 304b, 304c and 304d share a common floating diffusion 304e at the center of the combination green pixel 304. Within the combination red pixel 302, the d-DTI structure 301a isolates the photodiode 302a from the photodiode 302b, the photodiode 302c from the photodiode 302d, the photodiode 302a from the photodiode 302c, and the photodiode 302b from the photodiode 302d. Within the combination green pixel 304, the d-DTI structure 301a isolates the photodiode 304a from the photodiode 304b, the photodiode 304c from the photodiode 304d, the photodiode 304a from the photodiode 304c, and the photodiode 304b from the photodiode 304d. The combination red pixel 302 is adjacent to the combination green pixel 304. Between the combination red pixel 302 and the combination green pixel 304, there is the h-DTI structure 301b to isolate the photodiode 302c from the adjacent photodiode 304a, and the photodiode 302d from the adjacent photodiode 304b. Both the combination red pixel 302 and the combination green pixel 304 are enclosed on all sides by the h-DTI structure 301b.

Figure 4:
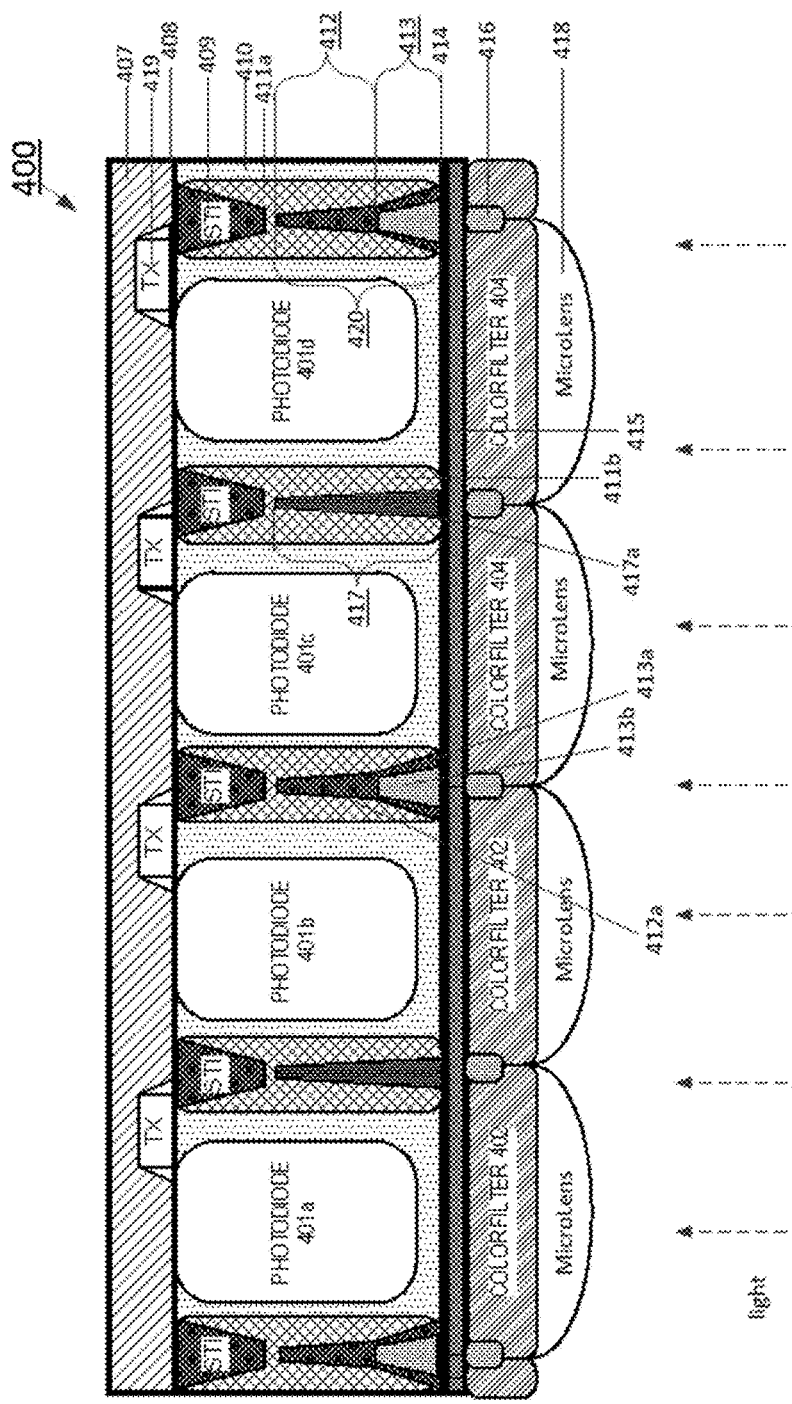
FIG. 4 is a magnified cross-section illustration of an example image sensor in FIG. 3 along A-A' direction, in accordance with an embodiment of the disclosure.

FIG. 4 is a cross-section illustration of an example image sensor 400 along A-A' direction in FIG. 3, in accordance with an embodiment of the disclosure. The image sensor 400 includes a semiconductor material 410 with a first side 414 as the backside of semiconductor material 410 and a second side 408 as the front side of semiconductor material 410. On the first side 414, there is dielectric material 415, a plurality of metal grids 416, a plurality of color filters 402 and 404, and a plurality of microlenses 418. On the second side 408, there are a plurality of transfer gates 419 and dielectric material 407. In the semiconductor material 410, there are a plurality of photodiodes 401a, 401b, 401c and 401d which may have same or different physical configurations, a plurality of shallow trench isolation (STI) structures 409 extending from the second side 408 toward the first side 414, a plurality of deep isolation wells 411 disposed between the first side 414 and the second side 408, a plurality of d-DTI structures 417 extending from the first side 414 toward the second side 408, and a plurality of h-DTI structures 420 extending from the first side 414 toward the second side 408.

In the illustrated example, the adjacent photodiodes are separated from each other by the deep isolation well 411. A first deep isolation well 411a, which is disposed between two adjacent photodiodes with different color filters, includes one respective optically aligned h-DTI structure 420 and one STI structure 409 with respect to incident light that is normal to the first side 414 of the semiconductor material 410. A second deep isolation well 411b, which is disposed between two adjacent photodiodes with same color filters, includes one respective optically aligned d-DTI structure 417 and one STI structure 409 with respect to incident light that is normal to the first side 414 of the semiconductor material 410.

In the illustrated example in FIG. 4, each of the d-DTI structures 417 includes a dielectric material only and extends from the first side 414 toward the second side 408 of the semiconductor material 410. Each of the h-DTI structures 420 includes a shallow portion 413 and a deep portion 412. The shallow portion 413 extends from the first side 414 toward the second side 408 of the semiconductor material 410. The shallow portion 413 includes a dielectric material region 413a and a metal region 413b such that at least part of the dielectric material region 413a is disposed between the metal region 413b and the semiconductor material 410. The deep portion 412 extends from the shallow portion 413 and is disposed between the shallow portion 413 and the second side 408 of the semiconductor material 410. The deep portion 412 may include dielectric material region 412a which may have the same or different dielectric materials in the dielectric material region 413a. The dielectric material region 412a and 413a may include one type of dielectric materials. The dielectric material region 412a and 413a may also include multilayers formed with different types of dielectric materials, wherein each layer may have a different type of dielectric materials including at least one positive charge dielectric material or one negative charge dielectric material. The layer abut to the semiconductor material 410 may have the highest dielectric constant among all the dielectric materials used. In one example, the multilayer may include a SiO2 layer and a high-k material layer between the SiO2 layer and the semiconductor material 410.

In some examples, the metal region 413b may include any one of the group comprising of W, Al, Cu, Ag, Au, Ti, Ta, Pb, and Pt. The dielectric materials in both d-DTI structures 417 and h-DTI structures 420 may include oxides/nitrides such as silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art will recognize that any stoichiometric combination of the above metals/semiconductors and their oxides/nitrides/oxynitrides may be used, in accordance with the teachings of the present invention.

The magnitude of electrical crosstalk between adjacent photodiodes may be reduced by electrically isolating individual photodiodes. The dielectric material region 413a in the shallow portion 413 and the dielectric material region 412a in the deep portion 412 of each individual h-DTI structures 420 may, at least partially, electrically isolate the adjacent photodiodes optically aligned with different color filters which are disposed proximate to the first side 414 of semiconductor material 410. The metal region 413b in the shallow portion 413 is also electrically isolated by the dielectric material region 413a from individual photodiodes. The adjacent photodiodes with same color filters may be, at least partially, electrically isolated by each individual d-DTI structure 417.

The magnitude of optical crosstalk between adjacent photodiodes with different color filters in the plurality of photodiodes 401a, 401b, 401c, and 401d may be reduced by the metal region 413b in each individual h-DTI structures 420. The metal region 413b may absorb, reflect, or refract incident light such that optical crosstalk is minimized. In one example, at least part of the metal region 413b is wider than the deep portion 412 of the h-DTI structure 420. As illustrated, the metal region 413b of the individual h-DTI structures 420 may taper from the first side 414 of the semiconductor material 410 towards the deep portion 412. The amount of taper for the metal region 413b may be designed such that off-axis incident light propagates through the first side 414 of the semiconductor material 410 and is reflected by the metal region 413b towards each of the plurality of photodiodes 401a, 401b, 401c and 401d.

In one example which is illustrated in FIG. 4, there is a tradeoff to use either the h-DTI structures 420 or the d-DTI structures 417 to isolate the adjacent photodiodes. For the h-DTI structures 420, the metal material such as W in the metal region 413b may absorb the incident light in order to minimize the optical cross talk, however, the light absorption also degrades the sensitivity of the image sensor. For the d-DTI structures 417, the dielectric materials 417a in the deep trench may not be able to absorb, reflect, or refract incident light in order to minimize the optical crosstalk. In order to maintain the sensitivity of the image sensors as well as reduce the optical and electrical cross talk, the h-DTI structures 420 are placed only between two adjacent photodiodes with the different color filters, whereas the d-DTI structures 417 are placed only between two adjacent photodiodes with the same color filters. In one example, the photodiode 401b with the red color filter 402 is separated from the photodiode 401c with the green color filter 404 by the h-DTI structure 420, and the photodiode 401a with the red color filter 402 is separated from the photodiode 401b also with the red color filter by the d-DTI structure 417. In one further example which is illustrated in FIG. 3, each of the combination multi-color pixels 202, 203, 204 and 205 are surrounded on all sides by the h-DTI structures 301, and within each of the combination multi-color pixels, there is only d-DTI structures 302 to separate the adjacent sub-pixels.

FIGS. 5A-5D illustrates an example method 500 for fabrication of an image sensor in FIG. 4. The order in which some or all of FIGS. 5A-5D appear in method 500 should not be deemed limiting. Rather, one of ordinary skill in the art having the benefit of the present disclosure will understand that some of method 500 may be executed in a variety of orders not illustrated, or even in parallel. Furthermore, method 500 may omit certain process steps and figures in order to avoid obscuring certain aspects. Alternatively, method 500 may include additional process steps and figures that may not be necessary in some embodiments/examples of the disclosure.

FIG. 5A illustrates a semiconductor material 504 having a first side 521 opposite a second side 520. In one example, semiconductor material 504 is silicon. A plurality of photodiodes 501a, 501b, 501c, and 501d are disposed in the semiconductor material 504 between the first side 521 and the second side 520. In one example, the plurality of photodiodes is formed by ion implantation. A plurality of deep isolation wells 502 are disposed in the semiconductor material 504. Each individual deep isolation well 502 may extend from the first side 521 to the second side 520 of semiconductor material 504. In one example, individual photodiodes 501a, 501b, 501c, and 501d are disposed between individual deep isolation wells 502. In one example, the plurality of deep isolation wells 502 are formed by ion implantation. A plurality of first trenches 503 are etched that extend from the first side 521 towards the second side 520 of semiconductor material 504. In one example, each individual first trench 503 is etched within individual deep isolation well 502 such that each individual first trench 503 is disposed within a corresponding deep isolation well 502.

FIG. 5B illustrates a step of selectively widening a shallow portion 505 in some of the plurality of first trenches 503 to form a plurality of second trenches 503a proximate to the first side 521 of the semiconductor material 504, wherein each of the plurality of the second trenches 503a with the widened shallow portion 505 is disposed between two adjacent photodiodes with different color filters which will be disposed in the subsequent steps after the step illustrated in FIG. 5D (not illustrated in FIG. 5A-5D).

In one example, the photodiode 501a and 501b will optically align with red color filters, and the photodiode 501c and 501d will optically align with green color filters. The second trench 503a is disposed between the photodiode 501b and 501c. The first trench 503 is disposed between the photodiode 501a and 501b.

In one example, a deep portion 506 in the plurality of the second trenches 503a is disposed between the shallow portion 505 and the second side 520 of the semiconductor material 504. In one example, the shallow portion 505 tapers from the first side 521 towards the second side 520 of the semiconductor material 504 such that a width of the shallow portion 505 proximate to the first side 521 is greater than the width of the deep portion 506 proximate to the second side 520.

FIG. 5C illustrates depositing a dielectric material 508 within the plurality of first trenches 503 and second trenches 503a. In one example, the plurality of first trenches 503 are completely filled by the dielectric material 508. On the other hand, the deep portion 506 in the plurality of second trenches 503a is also completely filled by the dielectric material 508. The shallow portion 505 of a plurality of second trenches 503a is partially filled by the dielectric material 508, which is disposed on the sidewalls of the shallow portion 505 of second trenches 503a. An empty space 507 is formed in the middle of the shallow portion 505 after the dielectric material 508 is deposited as shown in FIG. 5C.

FIG. 5D illustrates depositing metal 509 in the shallow portions 505 of the plurality of second trenches 503a to fill the empty space 507 shown in FIG. 5C. In one example, the empty space 507 in FIG. 5C is completely filled by metal 509. There is at least a part of the dielectric material 508 between metal 509 and the semiconductor material 504 to isolate metal 509 and the semiconductor material 504 electrically.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel array disposed in a semiconductor material between a first side and a second side of the semiconductor material, comprising: a plurality of first combination pixels, second combination pixels, dielectric deep trench isolation (d-DTI) structures and hybrid deep trench isolation (h-DTI) structures;
   wherein each of the first combination pixels includes at least two adjacent first photo sensitive elements configured to receive light of a first wavelength from the first side of the semiconductor material, wherein the two adjacent first photo sensitive elements are separated by one of the d-DTI structures;
   wherein each of the second combination pixels include at least two adjacent second photo sensitive elements configured to receive light of a second wavelength from the first side of the semiconductor material, wherein the two adjacent second photo sensitive elements are separated by one of the d-DTI structures;
   wherein at least one of the first combination pixels is adjacent to at least one of the second combination pixels;
   wherein at least one of the h-DTI structures is disposed between the first and the second combination pixel; and
   wherein each of the h-DTI structures comprises a shallow portion and a deep portion, wherein the shallow portion includes a metal region wider than the deep portion.

2. The pixel array of claim 1, wherein each of the first and second combination pixels is enclosed on all sides by the h-DTI structures.

3. The pixel array of claim 1,
   wherein the shallow portion extends from the first side towards the second side of the semiconductor material, and includes a dielectric region and the metal region such that at least part of the dielectric region is disposed between the semiconductor material and the metal region; and
   wherein the deep portion extends from the shallow portion and is disposed between the shallow portion and the second side of the semiconductor material.

4. The pixel array of claim 3, wherein the shallow portion tapers from the first side of the semiconductor material towards the deep portion such that a width of the shallow portion proximate to the first side is greater than a width of the deep portion proximate to the second side.

5. The pixel array of claim 3, wherein at least part of the metal region is wider than the deep portion.

6. The pixel array of claim 3, wherein the deep portion of each h-DTI structure include a dielectric material.

7. The pixel array of claim 6, wherein the dielectric region of the shallow portion in each h-DTI structure includes the dielectric material.

8. The pixel array of claim 1, wherein the first wavelength is different from the second wavelength.

9. A high dynamic range image sensor pixel array disposed in a semiconductor material between a first side and a second side of the semiconductor material, comprising: a plurality of first combination pixels, second combination pixels, d-DTI structures and h-DTI structures;
   wherein each of the first combination pixels includes at least two adjacent first photo diodes configured to receive light of a first wavelength from the first side of the semiconductor material, wherein the two adjacent first photo diodes are separated by one of the d-DTI structures, and each first photo diode is coupled to a first floating diffusion through a first transfer gate, wherein the first floating diffusion is shared between the at least two adjacent first photo diodes;
   wherein each of the second combination pixels includes at least two adjacent second photo diodes configured to receive light of a second wavelength from the first side of the semiconductor material, wherein the two adjacent second photo diodes are separated by one of the d-DTI structures, and each second photo diode is coupled to a second floating diffusion through a second transfer gate, wherein the second floating diffusion is shared between the at least two adjacent second photo diodes;
   wherein at least one of the first combination pixels is adjacent to at least one of the second combination pixels;
   wherein at least one of the h-DTI structures is disposed between the first combination pixel and the second combination pixel; and
   wherein each of the h-DTI structures comprises a shallow portion and a deep portion, wherein the shallow portion includes a metal region and is wider than the deep portion.

10. The high dynamic range image sensor pixel array of claim 9, wherein each of the first and second combination pixels is enclosed on all sides by the h-DTI structures.

11. The high dynamic range image sensor pixel array of claim 9,
    wherein the shallow portion extends from the first side towards the second side of the semiconductor material, and includes a dielectric region and the metal region, such that at least part of the dielectric region is disposed between the semiconductor material and the metal region; and
    wherein the deep portion extends from the shallow portion and is disposed between the shallow portion and the second side of the semiconductor material.

12. The high dynamic range image sensor pixel array of claim 10, wherein the shallow portion tapers from the first side of the semiconductor material towards the deep portion, such that a width of the shallow portion proximate to the first side is greater than a width of the deep portion proximate to the second side.

13. The high dynamic range image sensor pixel array of claim 10, wherein at least part of the metal region is wider than the deep portion.

14. The high dynamic range image sensor pixel array of claim 10, wherein the deep portion of each h-DTI structure includes a dielectric material.

15. The high dynamic range image sensor pixel array of claim 14, wherein the dielectric region of the shallow portion in each h-DTI structure includes the dielectric material.

16. The high dynamic range image sensor pixel array of claim 9, wherein the first wavelength is different from the second wavelength.

* * * * *